(12) United States Patent
Lee et al.

(10) Patent No.: US 6,434,042 B1
(45) Date of Patent: Aug. 13, 2002

(54) NON-VOLATILE SEMICONDUCTOR MEMORY DEVICE CAPABLE OF REDUCING READ TIME

(75) Inventors: Seok-Heon Lee; Suk-Chun Kwon, both of Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 6 days.

(21) Appl. No.: 09/703,393

(22) Filed: Oct. 31, 2000

(30) Foreign Application Priority Data

Nov. 1, 1999 (KR) ............................................. 99-47958

(51) Int. Cl.[7] ............................................... G11C 16/04
(52) U.S. Cl. ............................ 365/185.12; 365/189.05; 365/189.07
(58) Field of Search ........................ 365/189.05, 189.07, 365/189.09, 185.12, 185.17

(56) References Cited

U.S. PATENT DOCUMENTS 5,966,326 A * 10/1999 Park et al. ............. 365/185.03
6,266,270 B1 * 7/2001 Nobukata ............... 365/185.03

* cited by examiner

*Primary Examiner*—A. Zarabian
(74) *Attorney, Agent, or Firm*—Marger Johnson & McCollom, P.C.

(57) ABSTRACT

A semiconductor memory device includes page buffers having load transistors, each of which supplies load current to bitlines. The device also has a load control circuit, which is commonly connected to gates of the load transistor, having two discharge paths. The load control circuit discharges the gate voltage via the first discharge path when a gate voltage applied to the gates in read operation is higher than a target voltage, and discharges the gate voltage via the second discharge path when the gate voltage arrives at the target voltage. Therefore, it is possible to quickly set the gate voltage to the target voltage.

9 Claims, 4 Drawing Sheets

NON-VOLATILE SEMICONDUCTOR MEMORY DEVICE CAPABLE OF REDUCING READ TIME

This application relies for priority upon Korean Patent Application No. 99-47958, filed on Nov. 1, 1999, the contents of which are herein incorporated by reference in their entirety.

FIELD OF THE INVENTION

The present invention relates to semiconductor memory devices and, more particularly, to a semiconductor memory device having page buffer circuits.

BACKGROUND OF THE INVENTION

Semiconductor memory devices for storing data are typically classified into volatile and non-volatile types. The volatile memory devices cannot hold data stored in their memory cells when their power supplies are shut down. However, the non-volatile memory devices retain their stored data even without power supplies. Therefore, the non-volatile memory devices are widely used in applications where the possibility of power supply interruption is present.

One type of nonvolatile memory devices includes an electrically erasable programmable read only memory (EEPROM) device, which is generally referred to as a flash EEPROM device. An EEPROM device is constructed on semiconductor substrate with N-type source/drain regions, a channel region between the source/drain regions, a floating gate for storing electrical charge, and flash EEPROM cells having a control gate located over the floating gate. Operation modes of a flash memory device are include programming, erasing, and reading.

Conventionally, in order to store data in a flash EEPROM, the cell is programmed. But programming is carried out after erasing the cell, to ensure no residual charges are stored in the floating gate from a previous operation.

An erase operation is achieved by applying 0V to the control gate, and a high voltage (e.g., 20V) to a semiconductor substrate (or a bulk). In this state, negative charges accumulated in a floating gate are discharged to the semiconductor substrate via a tunneling oxide layer by a mechanism called "F-N tunneling (Fowler-Nordheim tunneling)". This makes an effective threshold voltage (Vth) of a flash memory cell transistor acquire a negative voltage. In erase operation, an EEROM cell stores logic "1" (or logic "0"). When a predetermined read voltage (Vread) is applied to the control gate during read operation (i.e., Vth<Vread), the cell transistor is at a conductive state (i.e., "ON").

Programming a flash EEPROM cell is achieved by applying a high voltage (e.g., 18V) to a control gate, and 0V to a source, a drain, and a semiconductor substrate. In this state, negative voltages are accumulated in an effective threshold voltage of the flash EEPROM by F-N tunneling. This makes an effective threshold voltage (Vth) of a flash EEPROM cell transistor have a positive voltage. In program operation, the EEPROM cell stores logic "0" (or logic "1"). When a predetermined read voltage (Vread) is applied to the control gate during read operation (i.e., Vth>Vread), the cell transistor is at a nonconductive state (i.e., "OFF").

Such program and read operations are disclosed in U.S. Pat. No. 5,841,721.

Reading the EEPROM cell is achieved by applying a read voltage to the control gate via a wordline, and by supplying load current to the drain region via a bitline. At this time, a source region is grounded. If an EEPROM cell is programmed, the EEPROM cell does not conduct cell current, and a voltage of a bitline connected thereto becomes higher than a predetermined voltage. If an EEPROM cell has not been programmed (or has been erased), the EEPROM cell will flow a large amount of cell current, and thus pull a voltage of a bitline down to a ground voltage. Thus, a bitline voltage (or current) is monitored to determine a programmed state (i.e., "1" or "0") of the EEPROM cell.

Referring now to FIG. 1, a NAND-type flash memory device including EEPROM cells is described. A memory device shown in FIG. 1 includes an array 10 having a plurality of memory cell strings 30. Each of the strings 30 is composed of a plurality of EEPROM cell transistors Mj (j=0~5), which are serially connected between a source of a string transistor SST and a drain of a ground selection transistor GST. The drain of string transistor SST is connected to a corresponding bitline BLi (i=0~1023). The source of ground selection transistor GST is connected to a common source line CSL. A gate of the string selection transistor SST is coupled to a string selection line SSL, and a gate of the ground selection transistor GST is coupled to a ground selection line GSL. Control gates of the EEPROM cell transistors M0~M15 are coupled to corresponding wordlines WL0~WL15, respectively. The lines SSL, WL0~WL15, and GSL are led from a row decoder circuit 20.

A read operation is carried out using page buffers 40 is shown in FIG. 1. Such page buffers are disclosed in U.S. Pat. No. 5,761,132.

Referring now to FIG. 2, a timing view is given to illustrate how the read operation is performed. When the read operation starts, signals SBL and DCB are activated, each with a low-to-high transition, as shown in FIG. 2. Thus, NMOS transistors 42 and 43 of page buffers 40 are turned on, and sensing nodes S0 are discharged to a logic low level (e.g., a ground voltage level). And, bitlines BL0-BL1023 (each of which is connected to sensing nodes S0 via depletion transistors 48) are also discharged to a logic low level.

String and ground selection line signals SSL and GSL, and unselected wordlines (e.g., WL1~WL15) are driven with a predetermined voltage (Vr) for carrying out a read operation controlled by a row decoder circuit 20. Signals Olatch and Osae, and a selection wordline (e.g., WL0) all retain a ground voltage level, and signal Oblsh retains a logic high level (e.g., a power supply voltage level). In this state, a node A0 retains a logic high level (i.e., a power supply voltage level) via PMOS transistors 51 and 52. The node A0 is commonly coupled to gates of PMOS transistors 41 (serving as load transistors) which are coupled to bitlines BL0~BL1023, respectively.

With low-to-high transition of the signal Osae, a PMOS transistor 51 is turned off, while an NMOS transistor 54 is turned on. Thus, the node A0 decreases to a specific voltage level (e.g., 1.2V) from a power supply voltage level, via NMOS transistors 53 and 54. A reference voltage Vref of about 0.8V is applied to a gate of the transistors 53, lightly conducting a PMOS transistor 41 of each page buffer 40. Consequently, each of the bitlines BL0~BL1023 receives load current which flows thereinto, via corresponding PMOS transistors 41.

When load current is applied to each of the bitlines BL0~BL1023, a voltage induced to each bitline changes according to a state of a cell transistor. For example, when a selected flash EEPROM cell is programmed, load current is accumulated on a bitline, because a cell threshold voltage Vth is higher than a wordline voltage (e.g., 0V). Therefore, a bitline voltage is identical to, or higher than a predetermined voltage level (e.g., 0.9V). Thus, a depletion transistor 48 is shut off, and a sensing node S0 rises up to near the power supply voltage. On the other hand, when a cell is erased, load current is discharged to a common source line CSL via a cell, because a threshold voltage Vth of the cell is lower than a wordline voltage. Therefore, both a bitline and a sensing node S0 go to a ground voltage level.

When the signal Olatch then transitions from a low level to a high level, a node of each latch LT changes with a voltage level of the sensing node S0. In the former case, the node is grounded via the NMOS transistors 46 and 47, because they are turned on. In the latter case, the node holds an initially set level, because the NMOS transistor 46 is turned off.

Referring to FIG. 2, time required in a read operation, i.e., read time T1 is influenced by time T2 required for setting a voltage of a node A0 to a required voltage level. In other words, as time T2 is large, it forces time T1 to remain large.

Time T2 is large because the node A0 is commonly coupled to the gates of PMOS transistors 41 for applying load current to bitlines BL0~BL1023. Since there are 1024 such bitlines BL0~BL1023, the resistance and capacitance of the node A0 are very large. Therefore, it takes a long time to pull down the node A0 charged by a power supply voltage to a specific voltage (1.2V) by a load control circuit 50 constructed of two PMOS transistors 51 and 52, and two NMOS transistors 53 and 54. This is because a reference voltage of 0.8V is applied to the NMOS transistor 53.

Since therefore a voltage at the node A0 is hard to be pulled down to a target voltage level (1.2V) in a required time, load current is not sufficiently supplied to a bitline. Read time T1 should be lengthened for ensuring an error-free read operation. Alternatively, a voltage setting time T2 of a node A should be lengthened for sufficiently supplying a voltage. This leads to increasing the read time, which deteriorates the operational speed.

SUMMARY OF THE INVENTION

It is therefore an object of the invention to provide a non-volatile semiconductor memory device that can reduce read time so as to improve operation speed.

According to an aspect of the invention, a semiconductor memory device includes: an array of memory cells arranged at intersection regions of wordlines and bitlines, respectively; a plurality of load transistors which supply load current to their corresponding bitlines in a read operation; and a load control circuit for applying a voltage to a node during the read operation. The load control circuit is composed of: a first discharge circuit for discharging the voltage of the node in response to a sense enable signal in the read operation; a target voltage generator for generating a target voltage to be established at the node in response to the sense enable signal; a comparator for checking whether a current voltage of the node is higher than the target voltage; and a second discharge circuit for discharging the voltage of the node in response to one output of the comparison signal.

DESCRIPTION OF THE PREFERRED EMBODIMENT

Figure 2:
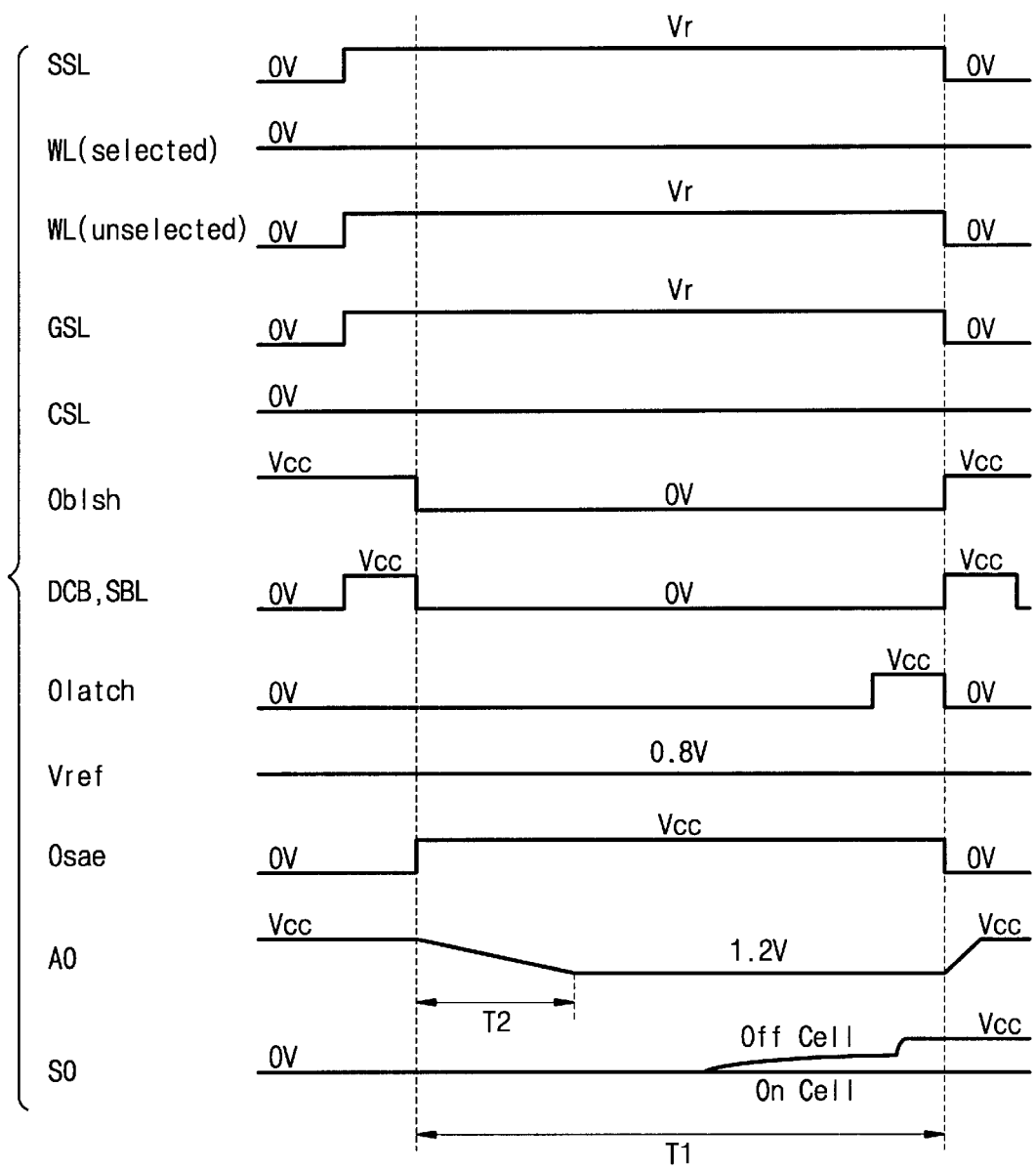
FIG. 2 shows timings of the circuits of FIG. 1 in a read operation.
Figure 3:
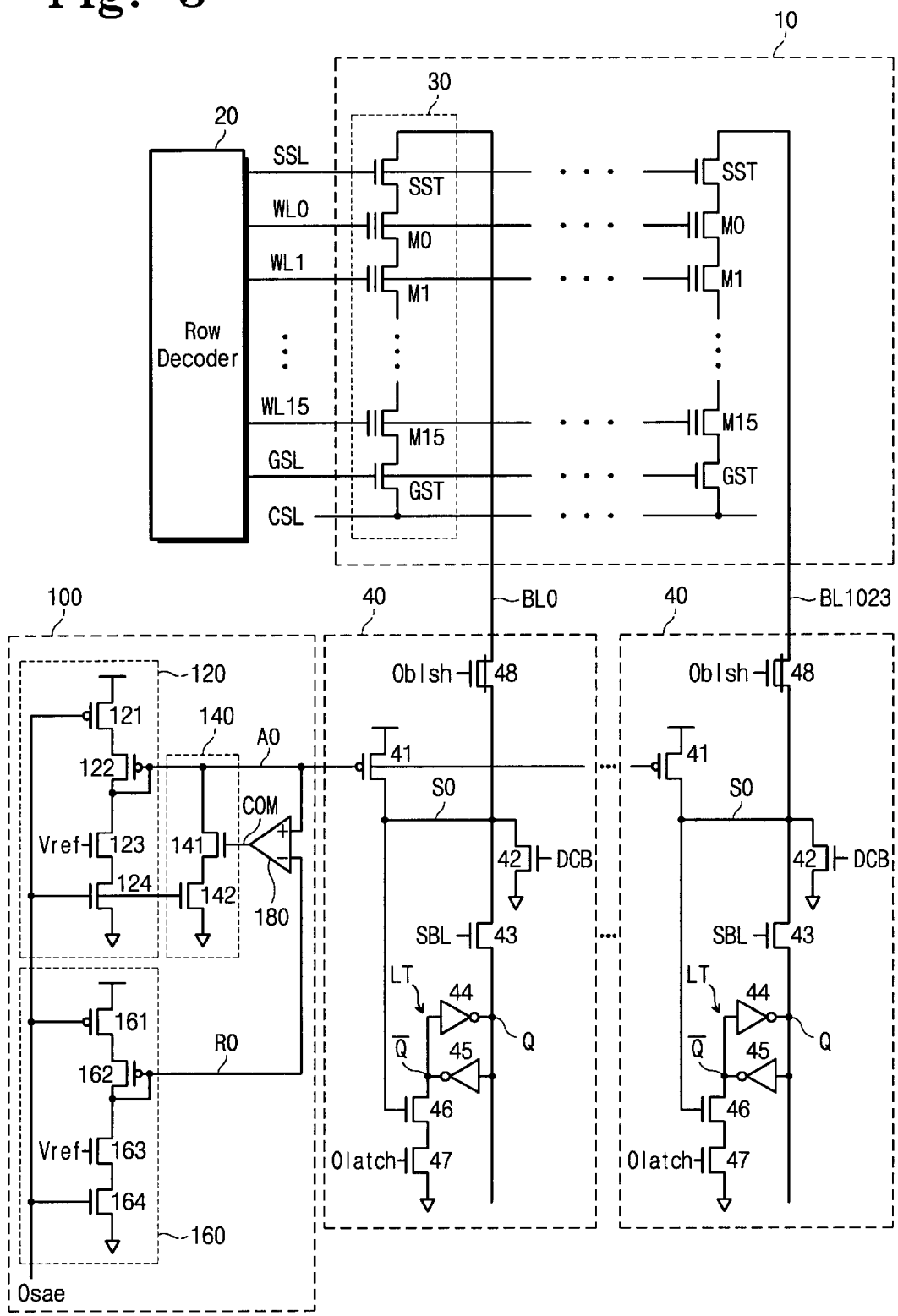
FIG. 3 is a circuit diagram showing a NAND-type flash memory device having a load control circuit in accordance with a preferred embodiment of the present invention.

Referring now to FIG. 3, a preferred embodiment of a NAND-type flash memory device is described more fully. Like numerals denote like elements FIG. 1 through FIG. 3, so that description thereof can be skipped.

Figure 1:
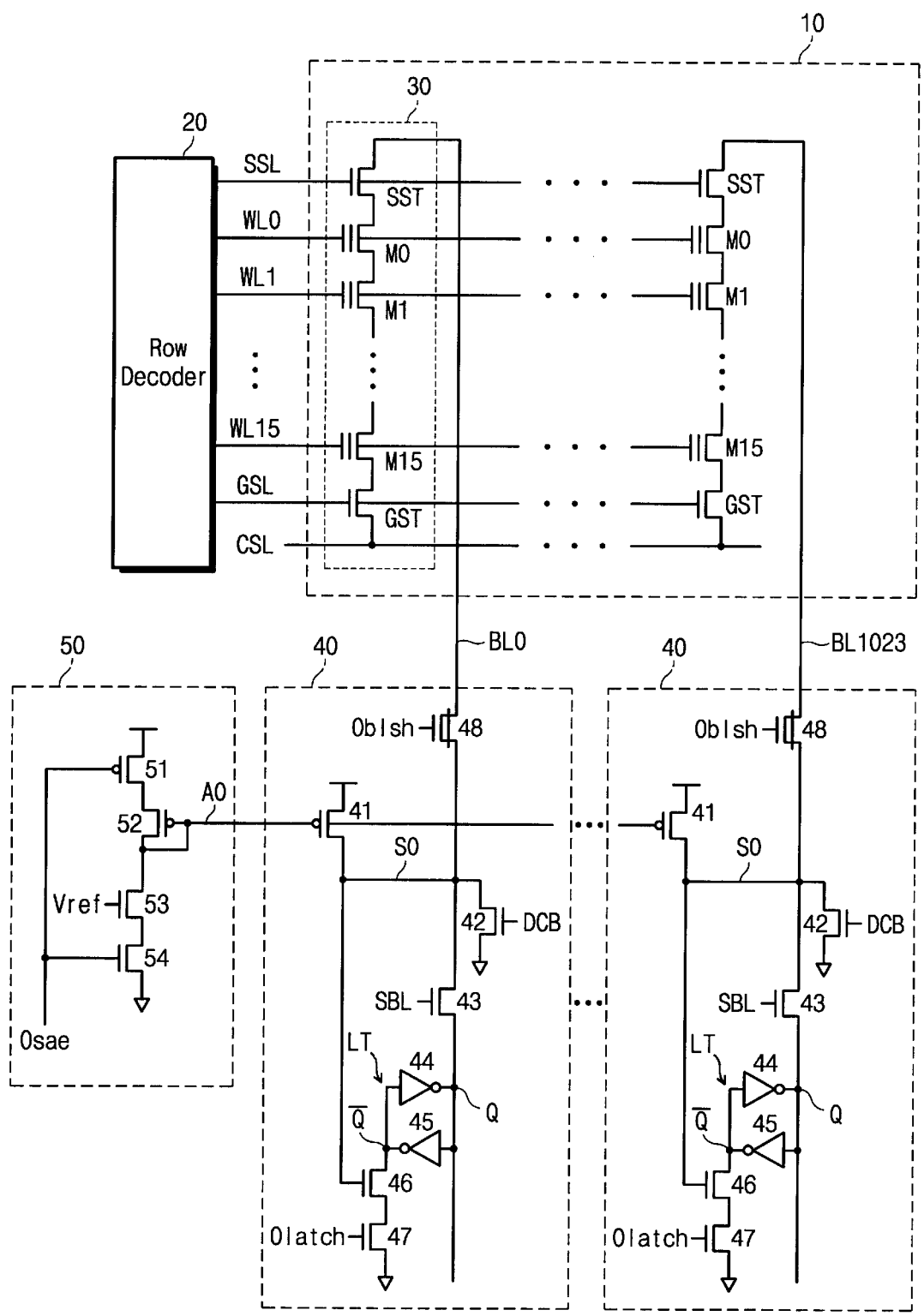
FIG. 1 is a circuit diagram showing a NAND-type flash memory device having a load control circuit in accordance with the prior art.

The memory device of FIG. 3 is different from that of FIG. 1 in that it includes a load control circuit 100. A feedback scheme is used to compose load control circuit 100 which controls a gate voltage of PMOS transistors 41 in page buffers 40 for supplying constant load current to bitlines BL0~BL1023 in a read operation, respectively.

The load control circuit 100 includes node A0, to which gates of the PMOS transistor 41 are commonly coupled. The load control circuit 100 also includes a first and second discharge circuits 120 and 140, a target voltage generator 160, and a comparator 180.

The first discharge circuit 120 is composed of two PMOS transistors 121 and 122, and two NMOS transistors 123 and 124. A gate of the PMOS transistor 121 is connected to a signal Osae, and a source thereof is coupled to a power supply voltage. The PMOS transistor 122 of which a source is coupled to a drain of the transistor 121 has a gate, which is commonly coupled to a node A0, and a drain. The NMOS transistors 123 and 124 are serially coupled between the node A0 and a ground. Gate of the transistors 123 and 124 are coupled to a reference voltage Vref of about 0.8V and the signal Osae, respectively. The second discharge circuit 140 is composed of NMOS transistors 141 and 142, which are serially coupled between the node A0 and the ground. A gate of the transistor 141 is coupled to a comparison signal COM outputted from the comparator 180. A gate of the transistor 142 is connected to the signal Osae.

The target voltage generator 160 is composed of two PMOS transistors 161 and 162, and two NMOS transistors 163 and 164. A gate of the PMOS transistor 161 is coupled to a sense enable signal Osae, and a source thereof is coupled to a power supply voltage. The transistor 161 has the same characteristics as the transistor 121 of the first discharge circuit 120. The PMOS transistor 162 of which a source is coupled to a drain of the transistor 161 has a gate, which is coupled to a node T0, and a drain. The transistor 162 has the same characteristics as the transistor 122 of the first discharge circuit 120. A drain of the NMOS transistor 163 is coupled to a node R0, and a source thereof is grounded via the NMOS transistor 164. Gates of the transistors 163 and 164 are coupled to a reference voltage of about 0.8V and the signal Osae, respectively. The transistor 163 has the same characteristics as the transistor 123 of the first discharge circuit 120, and the transistor 164 has the same characteristics as the transistor 124 of the first discharge circuit 120.

According to this structure, a target voltage outputted from the target voltage generator 160 (i.e., a voltage of the node R0) is set same as a gate voltage (a voltage of the node A0, 1.2V) of a load transistor, for supplying load current required as a reference input of the comparator 180.

The comparator 180 checks whether a voltage of the node A0 is higher than that of the node R0, i.e., compares voltages of the nodes A0 and R0. The comparator 180 then outputs a comparison signal COM depending on the outcome. For example, when the voltage of the node A0 is higher than that of the node R0, the comparison signal COM goes to a logic high level (e.g., a power supply voltage level). When the voltage of the node A0 is lower than that of the node R0, the comparison signal COM goes to a logic low level (e.g., a ground voltage level).

Based upon the load control circuit 100, when the signal Osae transitions from a low level to a high level in read operation, the voltage of the node A0 is discharged via the first and second discharge circuits 120 and 140. When the voltage of the node A0 is identical to, or lower than that of the node R0 (or arrives at a target voltage), a discharge path of the second discharge circuit 140 is cut off by the comparator 180. With such a feedback scheme, it is possible to reduce a time T2' (see FIG. 4) required for setting the voltage of the node A0 to a required voltage, in comparison with a conventional time T2 (see FIG. 2). As a result, read time T2' (see FIG. 4) can be reduced (operation speed can be improved).

Figure 4:
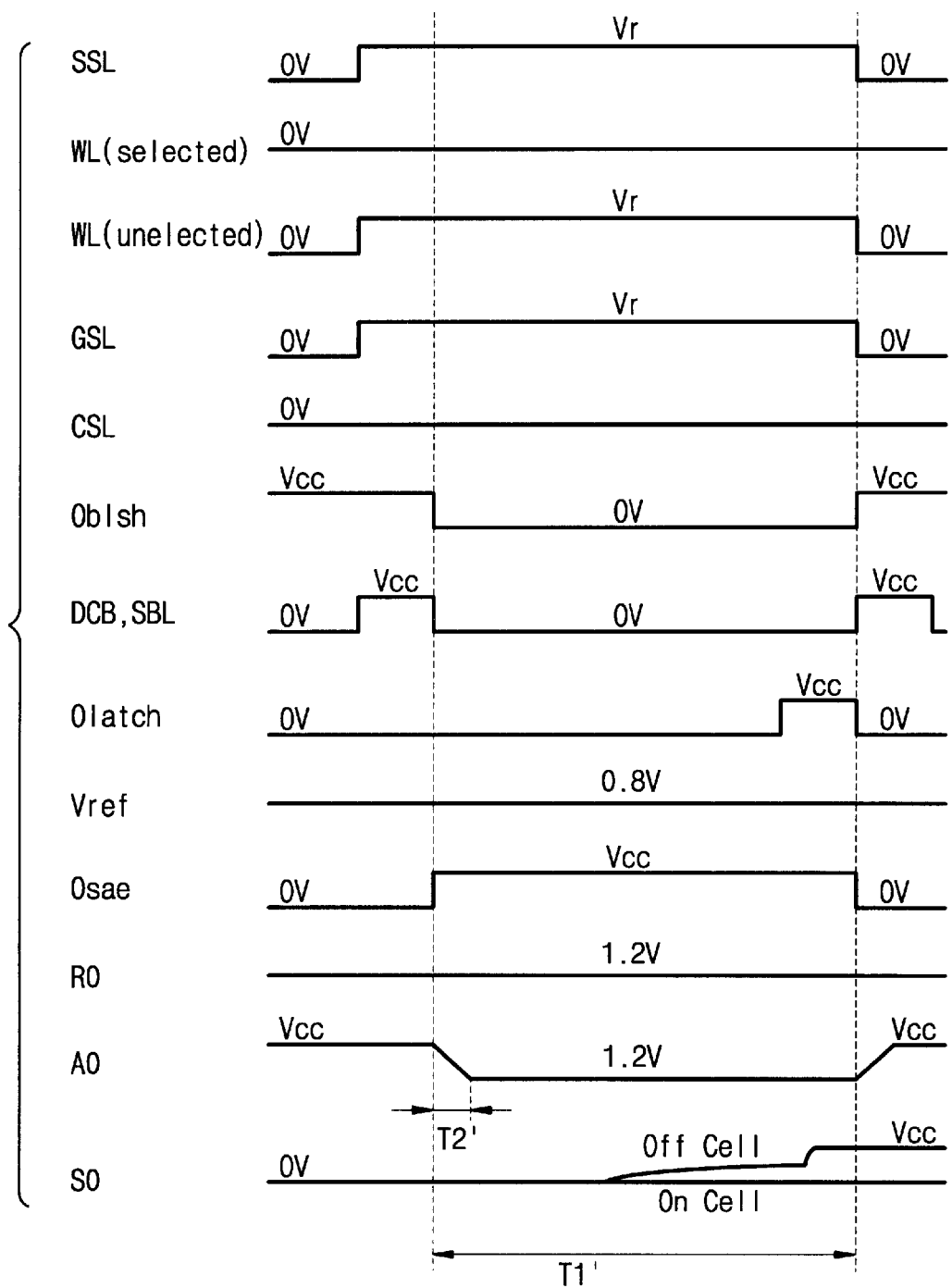
FIG. 4 shows timings of circuits shown in FIG. 3 in a read operation.

Referring now to FIG. 4, read operation is described more fully. When a read operation starts, signals SBL and DCB have low-to-high transition. Thus, NMOS transistors 42 and 43 of page buffers 40 are turned on, and sense nodes S0 is discharged to a logic low level (e.g., a ground voltage level). Bitlines, which are coupled to the sense nodes S0 via depletion transistors 48, respectively, are also discharged to a logic low level.

At this time, string and ground selection line signals SSL and GSL and unselected wordlines (e.g., WL1~WL15) are driven with a predetermined voltage Vr, for carrying out a read operation via a row decoder circuit 20. Further, signals Olatch and Osae and selected wordline (e.g., WL0) retains a ground voltage level, and a signal Oblsh retains a logic high level (e.g., a power supply voltage level). In this state, PMOS transistors 121 and 122 of a load control circuit 100 retain a logic high level, i.e., a power supply voltage level. Similarly, a node R0 also retains a power supply voltage level via PMOS transistors 161 and 162.

As a signal Osae then transitions from a low level to a high level, the PMOS transistor 121 of the first discharge circuit 120 and the PMOS transistor 161 of the target voltage generator 160 are turned off, while the NMOS transistor 124 of the first discharge circuit 120 and the NMOS transistor 164 of the target voltage generator 160 are turned on. Thus, voltages of the nodes A0 and R0 start being discharged via corresponding NMOS transistors 123, 124, 163, and 164. The comparator then compares a voltage of the node A0 with that of the node R0. Since loading of the node R0 is considerably smaller than loading of the node AO, the voltage of the node R0 goes to low faster than the voltage of the node A0. The signal COM outputted from the comparator 180 then goes to a logic high level, so that the NMOS transistor 141 of the second discharge circuit 140 is turned on. Therefore the voltage of the node A0 is discharged via the first and second discharge circuits 120 and 140. Thus, the voltage of the node A0 is fast discharged from a power supply voltage level to a specific voltage level (e.g., 1.2V), as shown in FIG. 4. A time T2' required for setting the voltage of the node A0 to a required voltage is shorter than the corresponding conventional time T2, as shown by comparing FIG. 4 to FIG. 2.

A PMOS transistor of each page buffer 40, which is operated as a load transistor, is lightly conducted by a voltage of the set node A0. Thus, each of the bitlines BL0~BL1023 receive load current which flows via their corresponding PMOS transistor 41. When the load current is supplied to each of the bitlines BL0~BL1023, voltages induced to each bitline are different from each other, depending on a state of a corresponding cell transistor. For example, when a flash EEPROM is programmed, load current is accumulated on a bitline because a threshold voltage (Vth) of a cell is higher than a wordline voltage (0V). A voltage level of the bitline then becomes higher than that of a predetermined voltage (e.g., 0.9V), so that a depletion transistor 48 is shut off, and a sense node S0 rises up to a power supply voltage level. On the contrary, when the cell is erased, the load current is discharged to a common source line CSL via the cell, because the threshold voltage (Vth) is lower than a wordline voltage. Thus, both a bitline and a sense node go to a ground voltage level.

When a signal Olatch transitions from a low level to a high level, a node changes with a voltage level of the sense node S0. That is, in the former case, the node is grounded via NMOS transistors 46 and 47, because they are turned on. In the latter case, the node retains an initially set level because they are turned off. Through a series of the procedures, read operation is completed.

As mentioned above, when a node voltage applied to gates of load transistors is higher than a required voltage, two discharge paths are formed to quickly discharge the node voltage to the required voltage. Therefore, it is possible to reduce a time required for read operation.

While the invention has been described in terms of the preferred embodiments, various alternatives and modifications can be devised by those skilled in the art without departing from the invention. Accordingly, the present invention is intended to embrace all such alternatives that fall within the scope of the appended claims.

What is claimed is:

1. A semiconductor memory device comprising:

an array of memory cells arranged at intersection regions of wordlines and bitlines;

a plurality of load transistors for supplying load current to their corresponding bitlines in a read operation, the load transistors having gates which are commonly coupled to a node during the read operation; and a load control circuit for applying a voltage to the node during the read operation, the load control circuit including:

a first discharge circuit for discharging a voltage of the node in response to a sense enable signal in the read operation;

a target voltage generator for generating a target voltage that is to be applied to the node in response to the sense enable signal;

a comparator for determining whether a present voltage of the node is higher than the target voltage; and a second discharge circuit for further discharging the voltage of the node in response to an output of the comparator.

2. The device of claim 1, wherein each of the memory cells includes an EEPROM cell transistor.

3. The device of claim 1, wherein an amount of current that is to flow via the second discharge circuit is greater than that via the first discharge circuit.

4. The device of claim 1, wherein the voltage of the node is discharged via the first and second discharge circuits when being higher than the target voltage, and is discharged via the first discharge circuit when arriving at the target voltage.

5. The device of claim 1, wherein the first discharge circuit includes:

a first PMOS transistor having a source coupled to a power supply voltage, a gate coupled to receive the sense enable signal, and a drain;

a second PMOS transistor having a source coupled to the drain of the first PMOS transistor, a gate commonly coupled to the node, and a drain;

a first NMOS transistor having a drain coupled to the node, a gate coupled to receive a reference voltage, and a source; and a second NMOS transistor having a drain coupled to the source of the first NMOS transistor, a gate coupled to receive the sense enable signal, and a grounded source.

6. The device of claim 5, wherein the target voltage generator includes:

a third PMOS transistor having a source coupled to the power supply voltage, a gate coupled to receive the sense enable signal, and a drain;

a fourth PMOS transistor having a source coupled to the drain of the third PMOS transistor, and a gate and a drain which are interconnected to output the target voltage;

a third NMOS transistor having a drain coupled to the gate and drain of the fourth PMOS transistor, a gate coupled to receive the reference voltage, and a source; and a fourth NMOS transistor having a drain coupled to the source of the third NMOS transistor, a gate coupled to receive the sense enable signal, and a grounded source.

7. The device of claim 6, wherein the first and third PMOS transistors are identical, the second and fourth PMOS transistors are identical, the first and third NMOS transistors are identical, and the second and fourth NMOS transistors are identical.

8. The device of claim 1, wherein the second discharge circuit includes a first NMOS transistor having a drain coupled to the node, a gate connected to receive the output of the comparator, and a source grounded via a second NMOS transistor switched on/off by the sense enable signal.

9. The device of claim 1, further comprising a plurality of latches which are coupled to the bitline, respectively.

* * * * *